US008018096B1

(12) United States Patent
Maier, II

(10) Patent No.: US 8,018,096 B1
(45) Date of Patent: Sep. 13, 2011

(54) INDUCTIVE PULSE FORMING NETWORK FOR HIGH-CURRENT, HIGH-POWER APPLICATIONS

(75) Inventor: William Bryan Maier, II, Marina, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 12/689,848

(22) Filed: Jan. 19, 2010

Related U.S. Application Data

(62) Division of application No. 10/985,062, filed on Nov. 8, 2004, now Pat. No. 7,675,198.

(51) Int. Cl.
*H03K 3/02* (2006.01)

(52) U.S. Cl. ......... 307/108; 307/106; 307/113; 307/154

(58) Field of Classification Search .................. 307/108, 307/106, 113, 154
See application file for complete search history.

(56) References Cited

U.S. PATENT DOCUMENTS

| 4,423,662 | A | 1/1984 | McAllister |
|---|---|---|---|
| 4,480,523 | A | 11/1984 | Young et al. |
| 4,572,964 | A | 2/1986 | Honig |
| 4,608,908 | A | 9/1986 | Carlson et al. |
| 4,706,542 | A | 11/1987 | Hawke |
| 4,718,321 | A | 1/1988 | Honig et al. |
| 4,718,322 | A | 1/1988 | Honig et al. |
| 4,864,911 | A | 9/1989 | McKee et al. |
| 4,885,974 | A | 12/1989 | Honig |
| 4,986,161 | A | 1/1991 | Schron et al. |
| 4,987,821 | A | 1/1991 | Kemeny et al. |
| 4,996,455 | A | 2/1991 | Loffler et al. |
| 5,081,901 | A | 1/1992 | Kemeny et al. |
| 5,155,289 | A | 10/1992 | Bowles |
| 5,183,956 | A | 2/1993 | Rosenberg |
| 5,285,763 | A | 2/1994 | Igenbergs |
| 5,393,350 | A | 2/1995 | Schroeder |
| 5,439,191 | A | 8/1995 | Nichols |
| 5,597,976 | A | 1/1997 | Schroeder |
| 7,077,046 | B2 | 7/2006 | Nelyubin |
| 7,675,198 | B1 | 3/2010 | Maier, II |

OTHER PUBLICATIONS

Pokryvailo, A., "To The Theory of Parallel Railgun Driven by an Inductive Storage Power Supply", Pulser Power Conference, 1999, pp. 1345-1348, Digest of Technical Papers 12 IEEE International, vol. 2, Jun. 27-30, 1999, Monterey, California.

Pokryvailo, A., Maron, V., and Melnik, D., "Review of Opening Switches for Long-Charge Fieldable Inductive Storage Systems", Proceedings12th IEEE International Conference Pulse Power, pp. 1341-1344, Jun. 27-30, 1999, Monterey, California.

*Primary Examiner* — Jared Fureman
*Assistant Examiner* — Adi Amrany
(74) *Attorney, Agent, or Firm* — Donald E. Lincoln; Lisa A. Norris

(57) ABSTRACT

An inductive pulse forming network stores electrical energy delivered from an outside prime power supply in the electric field of a low-voltage, high-energy density network capacitor. Through timed actuation of a series of one or more switches, the energy stored in the electric field of the network capacitor is subsequently converted to electrical energy stored in the magnetic field of a network inductor. The energy stored in the network inductor supplies high-current, high-power electrical energy to drive an electromagnetic launcher such as a railgun.

7 Claims, 5 Drawing Sheets

INDUCTIVE PULSE FORMING NETWORK FOR HIGH-CURRENT, HIGH-POWER APPLICATIONS

This application is a divisional application of U.S. patent application Ser. No. 10/985,062, filed Nov. 8, 2004, issued Mar. 9, 2010 as U.S. Pat. No. 7,675,198, which is hereby incorporated in its entirety by reference and the benefit of which is hereby claimed.

BACKGROUND OF THE INVENTION

1. Field of the Invention

The present invention generally relates to pulse forming networks. More particularly, the present invention relates to high-current, high-power, inductive pulse forming network for use with electromagnetic launchers such as railguns and electromagnetic aircraft launchers.

2. Description of the Related Art

A Pulse forming network (PFN) is an electrical circuit or device that provides a high-power, short-duration pulse of electrical energy of desired waveform. The elements of a PFN are electrically coupled and configured to make a transient current pulse of specific waveform across a load when a load switch is closed.

PFNs have applications, well known to those of skill in the art, in high-power, short-duration power supplies used, for example, in pulsed lasers, pulsed magnetic plasma confinement machines, high-powered microwave weapons, pulsed accelerators for flash x-ray and pulsed electron beam machines, electromagnetic launch systems, and railgun weapons.

In these applications, extremely high average power and extremely high total energy output are required for each current pulse delivered by the PFN to a connected load. To deliver high total energy, several energy storage devices for use with PFNs were previously investigated including batteries, inertial flywheels wound with coils, such as, compulsators, super-conducting magnetic energy storage devices, and high-voltage capacitors.

The United States Navy has attempted to develop a railgun with a projectile range in excess of 370 km (200 Nautical Miles), far exceeding the range of conventional shipboard weapons systems utilizing chemical propellants. In a typical design for a shipboard installed railgun application, it has been shown that between 15 and 20 Megawatts of average power over 8 milliseconds—about 160 Megajoules of total breech energy must be delivered by a PFN to accelerate a useful projectile to about 2.5 Kilometers/Second (km/s). When a railgun of this type is fired at a rate of six rounds per minute, it was shown to draw a peak power of about 20 Gigawatts, to be provided six times per minute. This large peak power requirement made the ship's bus incapable of directly supplying power to the railgun.

The operation of a railgun is straightforward. A current is passed through two metal rails electrically coupled by an armature such as a conductive projectile across the rails. The rails are not only conduits of the current but are, as well, guides within the railgun barrel for the moving projectile. The current supplied by the PIN and flowing across the conductive projectile through the rails, generates a magnetic field around each of the rails. This magnetic field acts on the electric current flowing through the projectile and the resulting Lorentz force accelerates the projectile along the rails and out of the railgun barrel.

The Lorentz force on a railgun projectile is given by:

$$F = L'I^2/2,$$

where I is the current through the projectile and L' is the inductance gradient of the rails, which in prior art railguns designs developed by the United States Navy was of the order of $3 \times 10^{-7}$ Henries/meter.

Very high currents (a few million amperes) were require to accelerate sufficiently massive projectiles to the desired railgun muzzle exit speeds of about 2 to 2.5 Kilometers/Second. In a prior art capacitive PFN, high current was supplied by high-voltage parallel-coupled capacitors, in the range of about 5-20 kilovolts (kV), that were connected across the railgun load through a series coupled inductor.

After charging from a high-voltage source, the high-voltage capacitors were connected to the railgun load and were next fully discharged through the series inductor. The voltage of the capacitors was prevented from reversing by a high-current diode capable of withstanding high voltage potentials (typically >10 kV). In a manner known to those of skill in the art, in the capacitive PFN described above, pulse current through the railgun load fell, without reversing, with a time constant of L/R, where L and R are the inductance and resistance of the PFN/railgun load circuit.

The use of high-voltage capacitors in a capacitive PFN presented dangerous electrical conditions. However, putting many low-voltage (2-50 Volts) capacitors in series to supply the requisite high current did not work because the available energy was reduced and the equivalent series resistance (ESR) of the series low-voltage capacitors prevented extraction of the high currents required to drive the railgun. As is well known by those of skill in the art, real capacitors, as well as all real electrical components, include impedance associated with the departure of real electrical components from theoretically ideal electrical components.

High voltage capacitors are the most mature energy storage device available for use with a PFN. The characteristics of high-voltage capacitors are well known, they are widely used in the commercial sector, and they have among the highest energy densities, demonstrated to at least a level of 2.5 Megajoules/meter$^3$ (MJ/m$^3$), of any energy storage mechanisms being developed for shipboard use. High-voltage capacitors contain no moving parts and maintenance is straightforward. If a module fails, the capacitor bank that has failed is removed and replaced with a new one.

However, even at significantly higher energy densities, the space required for high-voltage capacitor banks capable of supplying the very high current and high peak and average power requirements of a shipboard railgun, are of great importance. Prior art designs for high-voltage capacitor PFNs used with railguns and other electromagnetic launchers such as aircraft carrier electromagnetic aircraft launch systems and electromagnetic aircraft recovery systems, are excessively heavy and bulky for practical application and have limited lifetimes.

Further, for railguns used as primary armament on armored fighting vehicles (AEV), where space and possibly weight are sharply restricted, no power supply suitably small and light has been developed. In addition, high-voltage capacitors used in prior art capacitive PFNs were typically restricted to a few simple geometric configurations such as square capacitors. These shapes were generally unsuitable for uses requiring atypical capacitor configurations, such as, for example, to fit along the inside of an AEV gun turret.

A current advance in capacitor design is a chemical double-layer, low-voltage capacitor, sometimes called an ultracapacitor, that has the potential to significantly increase capacitor energy density. These new low-voltage double layer capacitors are also easily configurable in a variety of complex space-efficient shapes.

However, as described above, prior art capacitive PFNs required high-voltage capacitors to supply the very high current and high peak and average power requirements of a shipboard railgun. What is needed to fully realize the performance advantages of railguns and other electromagnetic launch systems over convention systems, is a simple PFN structure and method of use that reduces the weight, space, and complexity requirements of prior art PFNs. The innovative PFN would advantageously utilize a high energy density, intrinsically safer low-Voltage ultracapacitors, potentially configurable in a variety of useful, space efficient shapes, to provide a high-current, high-power pulse of desired waveform.

SUMMARY OF THE INVENTION

In accordance with one embodiment of the present invention, in an inductive PFN, electrical energy supplied from an outside prime power supply is stored in the electric field of a low-voltage, high-energy density network capacitor. The energy stored in the electric field of the network capacitor is subsequently converted to energy stored in the magnetic field of a network inductor.

In one embodiment, the energy stored in the network inductor is used to supply power to drive an electromagnetic launcher such as a railgun. A very simple inductive PFN electrical circuit converts low-voltage energy in the network capacitor into a current source capable of producing a high-current pulse at the voltage required to overcome the impedance of the connected electromagnetic launcher load.

Advantageously, the inductive PFN of the present invention provides a high-power, high-current pulse with smaller size and weight than the capacitive PFN of the prior art. Further, in contrast to prior art capacitive PFNs, the present invention allows the use of currently available, low-voltage, high energy density capacitors in place of high-voltage capacitors. Yet further, in one embodiment, the present invention minimizes the problem of high ESR associated with capacitive PFNs utilizing low-voltage, series coupled capacitors to produce a high-current power supply.

More particularly, in one embodiment, the present invention provides an inductive PFN circuit as a power supply connected to a railgun load. The inductive PFN circuit includes a high energy density, low-voltage network capacitor chargeable by an outside prime power supply, a first network switch, a second network switch, and a load switch, each switch coupled to the network capacitor in series. The inductive PFN circuit of the present invention further includes a network inductor coupled in parallel from between the second network switch and the load switch to the railgun load.

In another embodiment of the present invention, the network capacitor of the inductive PFN circuit is replaced by a bank of network capacitors coupled in parallel. In another embodiment, the network inductor is replaced by a bank of network inductors coupled in series. In yet another embodiment, both the network capacitor and the network inductor of the inductive PFN circuit of the present invention are replaced by a bank of network capacitors and a bank of network inductors, respectively, coupled as described above. Thus, embodiments of the inductive PFN circuit of the present invention may include one or more coupled network capacitors and/or one or more coupled network inductors.

Further, in accordance with the principles of the present invention, in one embodiment an inductive PFN system is provided that includes more than one inductive PFN coupled in parallel to a single load to provide sequential high-current pulses that provide increased overall current to the load during a single use. Said another way, a first inductive PFN embodiment and at least one addition inductive PFN embodiment are coupled in parallel to a single load to form an inductive PFN system that provides sequential high-current pulses used to form a desired waveform. Alternatively, an inductive PFN system including multiple inductive PFN embodiments coupled in parallel, provides repeated uses of the load in a more rapid succession than is provided by multiple chargings of a single inductive PFN. In yet another alternative, individual inductive PFNs of an inductive PFN system may be connected to physically discrete and electrically isolated rail segments of the railgun. The individual inductive PFNs are fired sequentially to provide a power pulse to the load at each rail segment. Alternatively, the individual inductive PFNs of the inductive PFN system are connected to different locations of electrically and physically continuous rails.

Yet further, in another embodiment, the network capacitor of the inductive PFN is oversized such that more energy is stored in the electric field of the network capacitor than is needed for a single use of the load. In this embodiment, by also providing additional switches, configured in a manner known to those of skill in the art, multiple consecutive uses of the load on a single charge of the oversized network capacitor of the inductive PFN is realized. Further, in this embodiment of properly switched and sized capacitor may drive several different inductors used to power discrete rail segments of a single railgun barrel or even to power multiple railgun loads.

By selecting the characteristics of the components of an inductive PFN or by combining various PFN embodiments into a system, the current pulse delivered by the inductive PFN may be shaped in a waveform desired for a particular application.

A method of using the inductive PFN includes first charging the network capacitor from the outside prime power supply while the first network switch and the load switch are set open and the second network switch is set closed. Next, after the network capacitor is charged, the first network switch is set closed. During a period after the first network switch closes, most of the energy originally stored in the electric field of the network capacitor is transferred to the magnetic field of the network inductor. At this time, the load switch connecting the inductive PFN circuit to the load is closed. Next, at a time shortly after the load switch is closed, and as discussed more fully below, the second network switch is opened causing a current very nearly equal to the current flowing through the network inductor to be driven through the connected load. Next, as time progresses, the voltage across the connected load adjusts to whatever value is necessary to keep the exponentially falling current flowing from the network inductor through the connected load. Thus, the network capacitor of the inductive PFN of the present invention may utilize a low-voltage ultracapacitor in contrast to the high-voltage capacitors required in prior art capacitive PFNs.

Accordingly, the inductive PFN circuit of the present invention used in the manner described above provides a high-power, high-current power supply source that intrinsically adjusts voltage to drive the load circuit, and which utilizes safer, low-voltage, variably configurable capacitors.

These and other features and advantages of the present invention will be more readily apparent from the detailed description set forth below taken in conjunction with the accompanying drawings.

DETAILED DESCRIPTION

In accordance with one embodiment of the present invention, in FIG. 1A, an inductive PFN 100 stores energy delivered from an outside prime power supply 120 in the electric field of a network capacitor 102 that is subsequently converted to energy stored in the magnetic field of a network inductor 114. Through a series of switches, the energy stored in the magnetic field of the network inductor is delivered as a high-current pulse to a connected load.

Figure 1A:
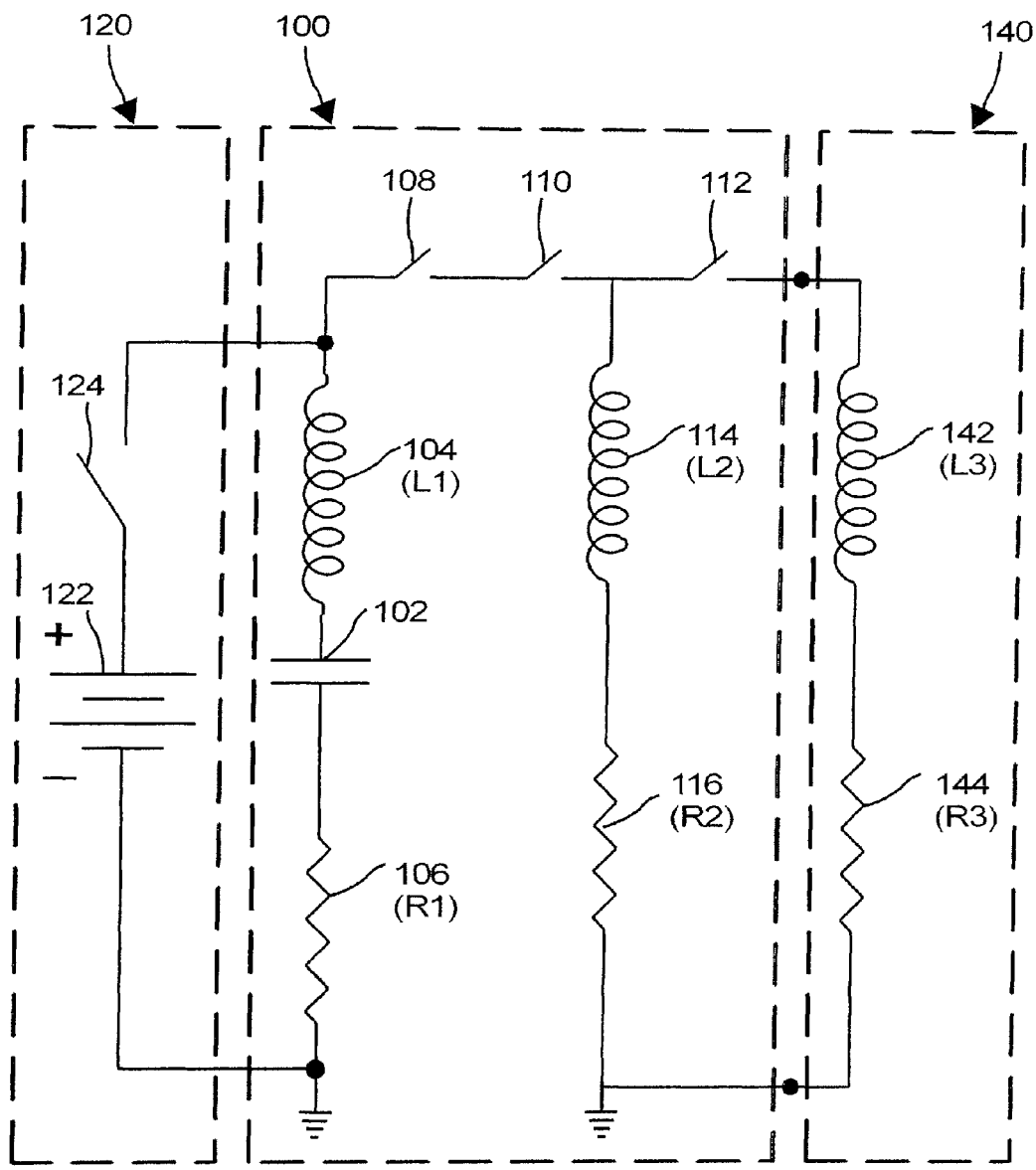
FIG. 1A is a circuit diagram of one embodiment of the inductive PFN of the present invention.

More particularly, FIG. 1A is a circuit diagram of one embodiment of inductive PFN 100 of the present invention for use as a high-current power supply in a railgun. Inductive PFN circuit 100 includes a network capacitor 102. As described above, associated with any real network capacitor 102 is a resistance $R_1$, represented by network capacitor equivalent resistor 106, and an inductance $L_1$, represented by network capacitor equivalent inductor 104, characterizing the departure of network capacitor 102 from an ideal capacitor. Network capacitor 102 is coupled in series to a first network switch 108, a second network switch 110, and a load switch 112. As described more fully below with reference to a Method 200 of use of inductive PFN 100 and a process flow diagram for Method 200 shown in FIG. 2A, in one embodiment first network switch 108 is eliminated. In another embodiment network load switch 112 is eliminated.

Network capacitor 102 is chargeable to the voltage level supplied by a voltage source 122 of outside prime power supply 120. Inductive PFN circuit 100 further includes a network inductor 114 coupled in parallel from between second network switch 110 and load switch 112 to a separate railgun load 140 to which inductive PFN 100 is coupled.

Railgun load 140 has impendence associated with the electrical components of railgun load 140 that includes an inductance represented by railgun inductor 142 and a resistance represented by railgun resistor 144, that must be overcome by the current supplied by inductive PFN 100 to fire a railgun projectile. The electrical components of inductive PFN 100 are sized such that the duration and magnitude of the power pulse supplied by inductive PFN 100 are sufficient to accelerate a projectile to the desired muzzle velocity of the railgun. In another embodiment, network capacitor 102 is sized such that sufficient electric field energy is stored in network capacitor 102 to supply more than one power pulse, each sufficient to operate the railgun and fire a railgun projectile. Said another way, network capacitor 102 is sized such that sufficient electric field energy is stored to operate railgun load more than once for each charging of inductive PFN 100 by outside prime power supply 120.

Further, in one embodiment, a network capacitor bank (not shown), made up of a plurality of network capacitors 102 coupled in parallel, i.e., at least one additional capacitor (not shown) coupled with network capacitor 102, is used to store electrical field energy, supplied by outside prime power supply 120, sufficient to fire at least one railgun projectile. In another, embodiment, a network inductor bank (not shown), made up of a plurality of network inductors 114 coupled in series, i.e., at least one additional inductor coupled with network inductor 114, is used to store magnetic field energy, supplied from the electric field of charged network capacitor 102, sufficient to fire a railgun projectile. In yet another embodiment, both a network capacitor bank and a network inductor bank, coupled as described, are used to store electrical and magnetic filed energy, respectively, sufficient to fire at least one railgun projectile.

Further, in one embodiment an inductive PFN system (not shown) includes a first inductive PFN 100, as shown in FIG. 1A, and at least one additional inductive PFN 100, coupled in parallel to railgun load 140. Through timed operation of a simple configuration of additional switches, such an inductive PFN system supplies multiple high-current pulses to railgun load 140. The operation and configuration of additional switches to supply multiple consecutive or concurrent high-current pulses would be apparent to one of skill in the art and so are not described further herein.

In one aspect of the present invention, network capacitor 102 is a low-voltage capacitor. As used herein, a low-voltage capacitor is a capacitor that operates in the voltage range of about 2 to 50 V. As described more fully below with reference to FIG. 2A, unlike prior art capacitive PFNs, the particular properties of inductive PFN 100 provide for the use of a low-voltage network capacitor 102 to supply a high-current electrical power pulse to railgun load 140.

However, the inductive PFN of the present invention does not require that network capacitor 102 have an operating range of about 2 to 50 V. Specifically, in one embodiment network capacitor 102 has an operating range greater than about 50 V. Future developments in capacitors might make voltages higher than 50V useful in the inductive PFN of the present invention. Said another way, double layer ultracapacitors with operating voltages in excess of those currently available may be developed in the future. Also, the inductive PFN works with capacitors that are not double-layer.

Figure 1B:
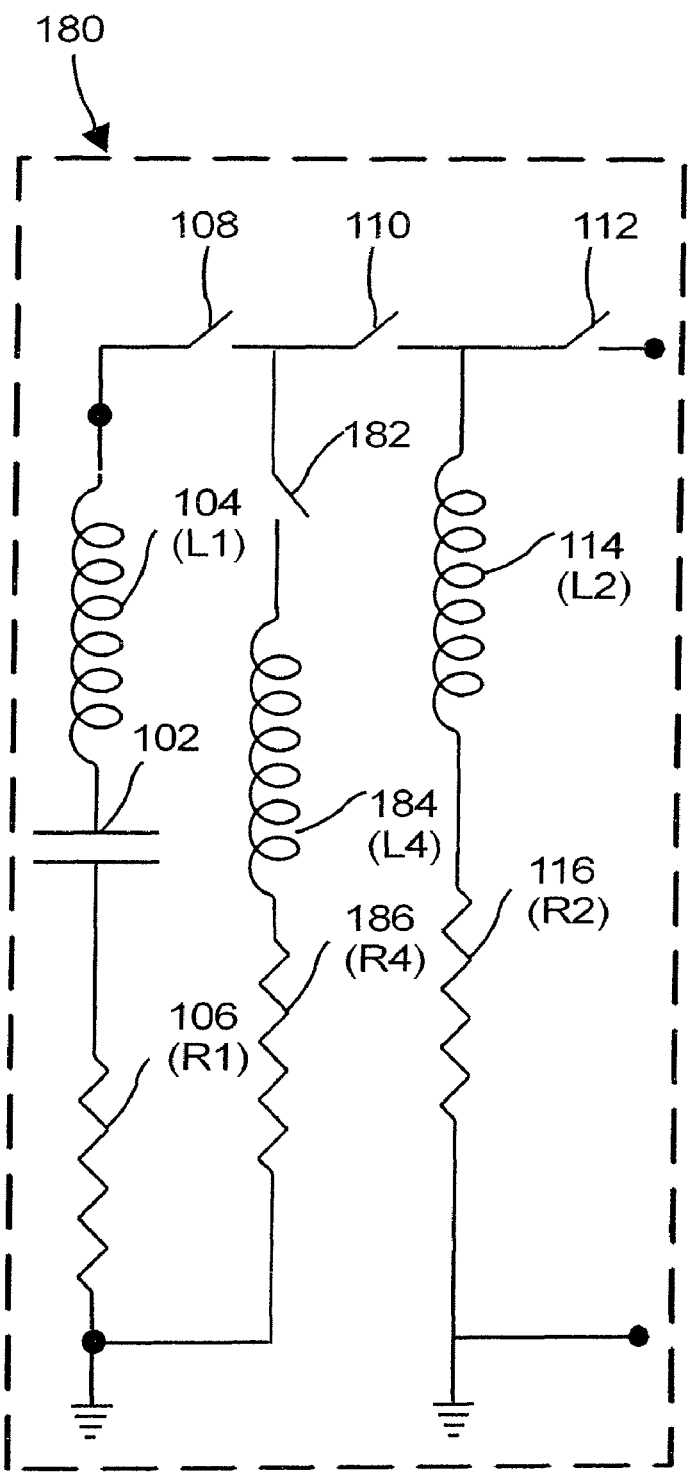
FIG. 1B is a circuit diagram of another embodiment of an inductive PFN that further includes an arc suppression system impedance device.
Figure 2A:
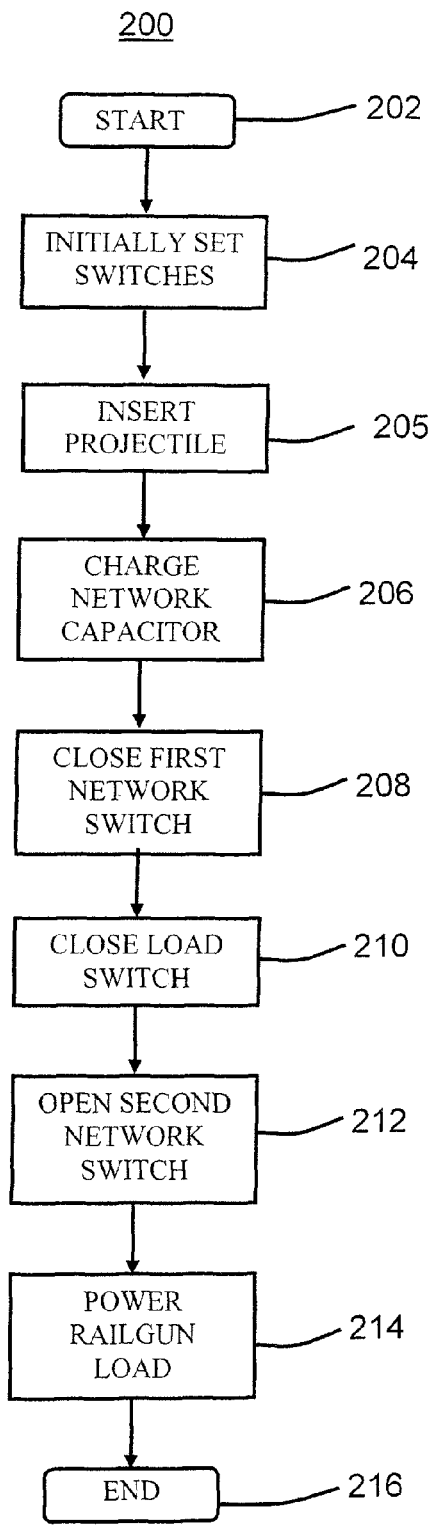
FIG. 2A is an example process flow diagram for a method of using the inductive PFN of the inductive PFN of the present invention shown in FIGS. 1A and 1B.

In another embodiment of the present invention shown in FIG. 1B, an arc suppression system switch and an arc suppression system impedance device, such as an inductor, are added to the components of inductive PFN 100 of FIG. 1A. FIG. 1B is a circuit diagram of another embodiment of an inductive PFN 180 that further includes an arc suppression system impedance device, such as an arc suppression system inductor 184. In other embodiments, the arc suppression system inductor may be replaced by another type of impedance device such as a resistor or a capacitor. FIG. 2A is an example process flow diagram for a Method 200 of using the inductive PFN of the present invention.

Referring to FIGS. 1B and 2A together, an inductive PFN 180 includes all of the elements of inductive PFN 100 shown in FIG. 1A. Inductive PFN 180 further includes an arc suppression system impedance device such as arc suppression system inductor 184, having an inductance $L_4$, coupled in parallel, through an arc suppression system switch 182, with network inductor 114 at a point between first network switch 108 and second network switch 110. As described above, associated with any real arc suppression system inductor 184, is a resistance, such as a resistance $R_4$, represented by arc suppression system resistor 186, and associated with arc suppression system inductor 184.

As discussed more fully below with reference to FIG. 2A, at an Open Second Network Switch Operation 212 of a Method 200 for using the inductive PFN of the present invention, second network switch 110 is open after network inductor 114 supports a magnetic field through the action of other operations in Method 200. In practice of Method 200 with inductive PFN 100 of FIG. 1, second network switch 110 typically cannot be opened without arcing because the inductance of network capacitor equivalent inductor 104 can never be exactly zero. Thus, in practice of Method 200, at Open Second Network Switch Operation 212 of a Method 200, the inductive PFN 180 avoids arcing of second network switch 110 by operation of arc suppression system inductor 184 or other arc suppression device.

As described above, in a typical use of inductive PFN 100 (FIG. 1A) or inductive PFN 180 (FIG. 1B) connected to railgun load 140, high currents are conducted. Thus, it is advantageous for second network switch 110 and load switch 112 to have high-current carrying capacity and low equivalent resistance. Accordingly, in one aspect of the present invention, second network switch 110 and load switch 112 are solid-state switches typically having low equivalent resistance. Additionally, solid-state switches operate well at low-voltages associated with the low-voltage network capacitor 102 utilized in one embodiment of the present invention. Further, in another embodiment second network switch 110 is a diode that, as is well known to those of skill in the art, closes automatically in response to the current conditions in inductive PFN 100.

Method 200 of use of the inductive PFN of the present invention is next described in more detail. FIG. 2 is an example process flow diagram for Method 200 of using the inductive PFN of the present invention. Referring to FIGS. 1A and 2A together, Start Operation 202 of Method 200 commences use of inductive PFN 100.

Next, Start Operation 202 transfers to Initially Set Switches Operation 204. When it is stated herein that a first operation transfers to a second operation, those of skill in the art understand that the first operation is completed and the second operation is started. In Initially Set Switches Operation 204, first network switch 108 and load switch 112 are set open and second network switch 110 is set closed. In use of Method 200 with inductive PFN 180 shown in FIG. 1B, arc suppression system switch 182 is also set open at Initially Set Switches Operation 204.

After the switches of inductive PFN 100 are initially set, Initially Set Switches Operation 204 transfers to Insert Projectile Operation 205. At Insert Projectile Operation 205, a conductive projectile (Not shown in FIG. 1A or 1B, see FIG. 1C) is loaded into the railgun by placing the conductive projectile across the rails (Not shown in FIG. 1A or 1B, see FIG. 10) of the railgun to form a closed circuit at railgun load 140.

After Insert Projectile Operation 205 is completed, operation transfers to Charge Network Capacitor Operation 206, where network capacitor 102 is charged from an outside prime power supply 120. By closing an outside prime power supply switch 124, an electric field associated with network capacitor 102 is formed. When network capacitor 102 is charged, Charge Network Capacitor Operation 206 transfers to Close First Network Switch Operation 208.

At Close First Network Switch Operation 208, first network switch 108 is closed at an initial reference time $t_0=0$. At reference time $t_0$ in the use of Method 200, inductive PFN circuit 100 is a "tank circuit", i.e., a parallel or series connection of inductive and capacitive components capable of storing or "tanking" electrical energy. Thus, if the relatively low impedance represented by network capacitor equivalent resistor 106, network capacitor equivalent inductor 104, and other equivalent circuit impedance (not shown) are disregarded, it is well known by those of skill in the art that, at a first time $t_1$ after initial reference time $t_0$ by a period of one LC circuit time constant approximately equal to:

$$(\Pi/2)(L_N C_N)^{1/2},$$

where $L_N$ is the inductance of network inductor 114 and $C_N$ is the capacitance of the network capacitor 102, most of the energy originally stored in the electric field of network capacitor 102 is transferred to the magnetic field of network inductor 114.

The energy stored in network inductor 114 at first time $t_1$, is given by:

$$L_N I_1^2/2,$$

where $I_1$ is the current through network inductor 114 at first time $t_1$ when most of the energy originally stored in the electric field of network capacitor 102 has transferred to the magnetic field of network inductor 114. At first time $t_1$, Close First Network Switch Operation 208 transfers to Close Load switch Operation 210.

During Close Load Switch Operation 210, load switch 112 is closed at first time $t_1$, thereby connecting railgun load 140 to inductive PFN 100. In use of Method 200 with inductive PFN 180 shown in FIG. 1B, arc suppression system switch 182 is closed at the same time that load switch 112 is closed at Close Load Switch Operation 210, i.e., at first time $t_1$. As described more fully below, at a second time $t_2$, a short period after first time $t_1$, Close Load Switch Operation 210 transfers to Open Second Network Switch Operation 212.

Figure 1C:
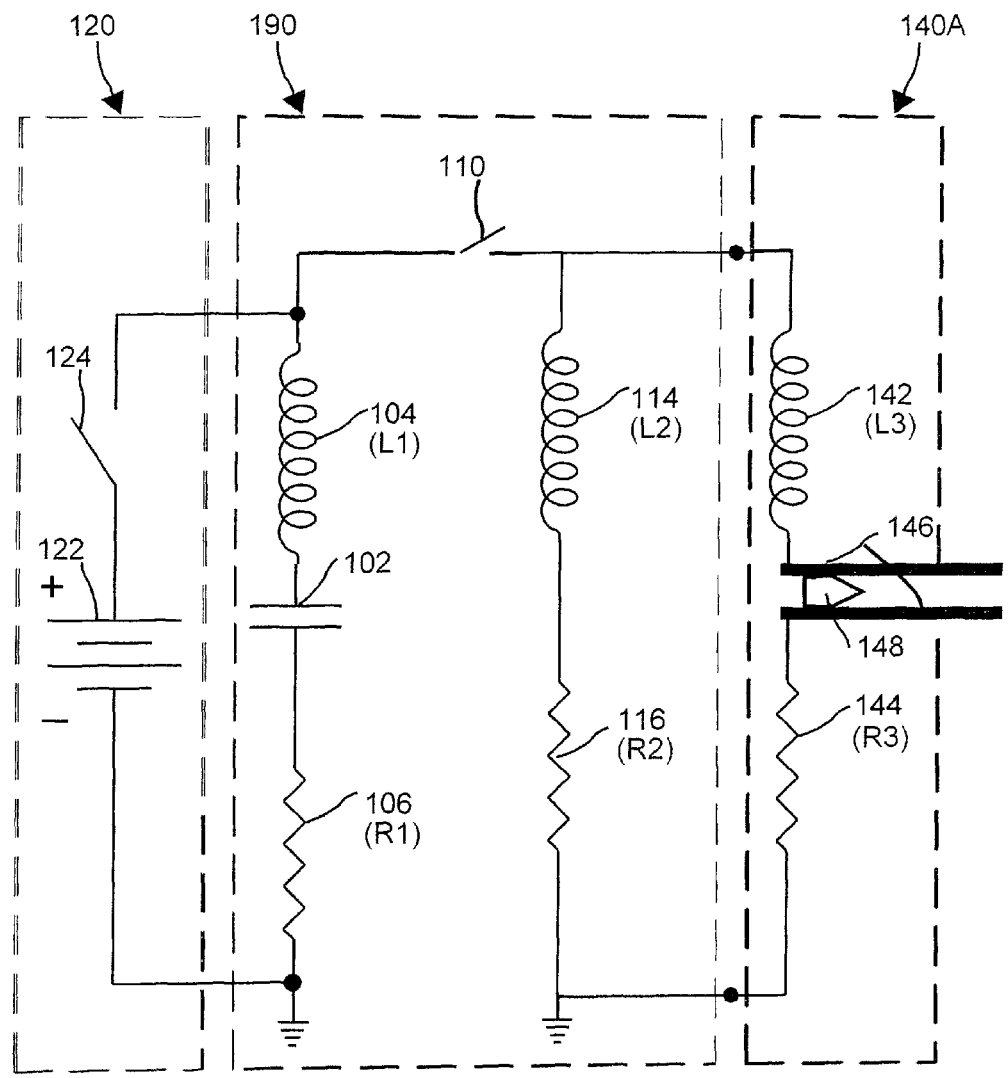
FIG. 1C is a circuit diagram of another embodiment of an inductive PFN that eliminates a first network switch and a load switch of FIG. 1A.

In another embodiment shown in FIG. 1C, first network switch 108 is eliminated and second network switch 110 performs the functions of first network switch 108 in inductive PFN's 100 and 180. Specifically, second network switch 110 is set open at Initially Set Switches Operation 204, then as described below with reference to FIG. 2B, at Close Second Network Switch Operation 208A, second network switch 110, performing the function of first network switch 108 in inductive PFNs 100 and 180, closes at initial reference time $t_0$ thereby commencing the energizing of network inductor 114.

Figure 2B:
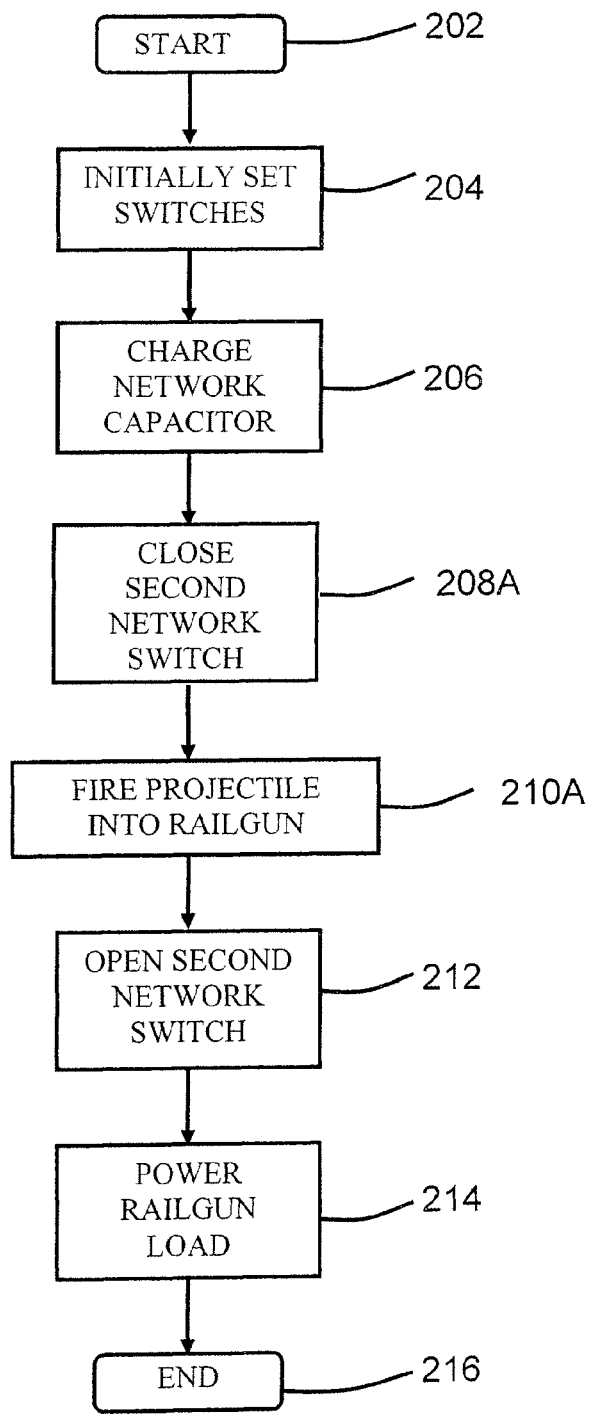
FIG. 2B is an example process flow diagram for a method of using the inductive PFN of the present invention shown in FIG. 1C.

As described below with reference to FIGS. 1C and 2B, in yet another embodiment, load switch 112 is also eliminated. FIG. 1C is a circuit diagram of another embodiment of an inductive PFN 190 that eliminates first network switch 108 and load switch 112 of FIG. 1A. FIG. 2B is an example process flow diagram for a method 260 of using inductive PFN 190 of the present invention as shown in FIG. 1C.

Referring to FIGS. 1C and 2B, in this embodiment, rails 146 of the railgun are electrically coupled to inductive PFN 190 of the present invention as shown and as described above with reference to inductive PFN 100. In inductive PFN 190, however, the conductive projectile 148 is not initially inserted across rails 146 at Insert Projectile Operation 205 described above with reference to Method 200 (FIG. 2A). Thus, initially, a railgun load 140A does not form a complete circuit and current cannot flow through railgun load 140A across rails 146.

Accordingly, in Method 260, Insert Projectile Operation 205 of Method 200 (FIG. 2A) is eliminated. Further, Close Load Switch Operation 210 of Method 200 is eliminated in Method 260 since load switch 112 of inductive PFN 100 of FIG. 1A and PFN 180 of FIG. 1B is eliminated in inductive PFN 190.

In Method 260, at Initially Set Switches Operation 204 is similar to that operation in Method 200 except that second network switch 110, substituting for first network switch 108, is set open. Charge Network Capacitor Operation 206, is identical to this operation in Method 200. Further, as described above, Close Second Network Switch Operation 208A of Method 260 substitutes for Close First Network Switch Operation 208 of Method 200.

However, even though load switch 112 has been eliminated, after inductive PFN 190 is changed at Operation 206 and second network switch 110 is closed in Operation 208A, current does not flow to railgun load 140A as described above with reference to Method 200, since railgun load 140A is not, at this point, completed across rails 146. As noted, projectile 148, needed to complete railgun load 140A, is not initially loaded into the railgun by insertion across rails 146 as in Operation 205 of Method 200.

After second network switch 110 is closed, Close Second Network Switch Operation 208A transfers to Fire Projectile Into Railgun Operation 210A. In this embodiment, projectile 148 is propelled into the railgun at rails 146 such that projectile 148 electrically couples rails 146 and makes-up the circuit of railgun load 140A at time $t_1$. Fire Projectile Into Railgun Operation 210A of Method 260 is analogous to and performs the same function, namely connecting completed railgun load 140A to the PFN, as Close Load Switch Operation 210 of Method 200 (FIG. 2A). In Method 260, projectile 148 may be fired into the railgun by means of chemical explosives, gravitational forces, or other suitable means.

In one embodiment, projectile 148 is fired into the railgun so that projectile 148 is initially propelled along rails 146 in a direction toward the muzzle end of the railgun barrel. Since network capacitor 102 is already charged at time $t_1$, it is advantageous to initially propel projectile 148 in a direction toward the muzzle end of the railgun barrel since Lorentz forces will immediately propel projectile 148 in this direction as soon as railgun load 140 is made-up when conductive projectile 148 contacts rails 146.

At this point, Fire Projectile Into Railgun Operation 210A ends and Method 260 transfers to Open Second Network Switch Operation 212, and then to Power Railgun Load Operation 214, which perform the same functions as the corresponding operations in Method 200 (FIG. 2A). As projectile 148 exits the railgun, Railgun Load 140A is again open across rails 146 and operation transfers to End Operation 216 thereby terminating Method 260.

Thus, in use of Method 260 with inductive PFN 190, at second time $t_2$, a short period after first time $t_1$ when projectile 148 is fired into the railgun and makes-up railgun load 140A, Operation 210 transfers to Open Second Network Switch Operation 212. Likewise, in use of Method 200 (FIG. 2A) with inductive PFN 100 (FIG. 1A) at second time $t_2$, a short period after first time $t_1$ when load switch 112 is closed, Close Load Switch Operation 210 transfers to Open Second Network Switch Operation 212.

In another embodiment of the present invention, an arc suppression system switch and an arc suppression system impedance device, such as an inductor, are added to the components of inductive PFN 190. The operation of these components is as described above with reference to inductive PFN 100 of FIG. 1A and so is not discussed further here. Further, as also described above, diodes may replace switches in inductive PFN 190.

Referring to FIGS. 2A and 2B, at second time $t_2$ of Method 200 or Method 260, second network switch 110 is opened during Open Second Network Switch Operation 212 and network capacitor 102 is thereby disconnected from network inductor 114, thus avoiding possible overvoltage of network capacitor 102, while, at the same second time $t_2$, network inductor 114 remains connected to railgun load 140 or 140A.

The result of Open Second Network Switch Operation 212 is that, at second time $t_2$, a railgun load current $I_{RG}$, initially very nearly equal to $I_1$, is driven through railgun load 140 or 140A, made up of the resistance represented by railgun resistor 144 and inductance represented by railgun inductor 142. The voltage across railgun load 140 or 140A at second time $t_2$ automatically rises to whatever voltage is required to maintain railgun load current $I_{RG}$ through railgun load 140 or 140A at a third time $t_3$ after second time $t_2$.

More particularly second time $t_2$, the time at which Open Second Network Switch Operation 212 commences, is chosen to avoid significant current draw through network capacitor 102 after current begins to flow through railgun load 140 when load switch 112 is closed or load 140A when projectile 148 is fired into the railgun. As used herein, significant current draw through network capacitor 102 means current through network capacitor 102 for a period sufficient to diminish the current through railgun load 140 or 140A such that the performance of the railgun is adversely affected.

Circuit simulation software indicates that $(t_2-t_1)$, the period between Close Load Switch Operation 210 of Method 200 or Fire Projectile Into Railgun Operation 210A of Method 260 and Open Second Network Switch Operation 212, of less than about 10% of $(t_1--t_0)$, the period required to transfer most of the energy originally stored in the electric field of network capacitor 102 to the magnetic field of network inductor 114, avoids significant current draw through network capacitor 102.

As described above with reference to Close First Network Switch Operation 208, $$(t_1-t_0) \approx (\Pi/2)(L_N C_N)^{1/2},$$

where $L_N$ is the inductance of network inductor 114 and $C_N$ is the capacitance of the network capacitor 102. Accordingly, time $t_2$, selected a period after $t_1$ of less than about, $$0.2(t_1-t_0),$$

avoids significant current draw through network capacitor 102.

As time progresses after second time $t_2$ to third time $t_3$, the current $I_{RG}$ through railgun load 140 intrinsically adjusts to:

$$I_{RG}=I_1 \exp[-((R_2+R_3)/2(L_2+L_3))(t)],$$

where $t=t_3-t_2$; $L_2$ is the inductance of network inductor 114 and $R_2$ is the resistance, represented by a network inductor equivalent resistor 116, characterizing the departure of network inductor 114 from an ideal inductor; and $L_3$ and $R_3$ are the resistance and inductance of railgun load 140, represented by railgun inductor 142 and railgun resistor 144, respectively.

Thus, after second time $t_2$, at third time $t_3$, Open Second Network Switch Operation 212 transfers to Power Railgun Load Operation 214. During Power Railgun Load Operation 214, network inductor 114, over time, provides a diminishing current to power railgun load 140 equal to $I_{RG}$ as described above. By application of the Lorentz force generated during Power Railgun Operation 214, the railgun projectile exits the railgun barrel, breaking railgun load 140 across the guide rails of the railgun, thereby isolating railgun load 140 from inductive PFN 100. This completes Power Railgun Load Operation 214 ending Method 200 at End Operation 216.

Those of skill in the art will recognize that the sequence of operations and the operations in Method 200 and 260 are illustrative only of one embodiment of the invention and are not intended to limit the invention. For example, Method 200 and 260 are repeatable for additional firings of a railgun and therefore the methods 200 need not end at End Operation 216 as described above, but rather upon completion, Power Railgun Load Operation 214 may transfer to Charge Network Capacitor Operation 206. Further, those of skill in the art will readily recognize that with minimal circuit modifications, other operations are adaptable to Method 200 and 260. For example, multiple inductive PFNs or an inductive PFN sized for multiple firings of a railgun may be connected to railgun load 140 through additional switching components to effect iterations of Power Railgun Load Operation 214.

Although the particular example relating to use of an inductive PFN with a railgun is described above, in light of this disclosure, it is understood that use of the inductive PFN of the present invention as a power supply for other loads is achievable. For example, the inductive PFN of the present invention may be modified with minimal effort to provide high-power, electrical energy to pulsed lasers, pulsed magnetic plasma confinement machines, high-powered microwave weapons, pulsed accelerators for flash x-ray and pulsed electron beam machines, electromagnetic launch systems, and electromagnetic recovery systems. The specific application and operations above were chosen for illustrative purposes only and should not be interpreted to limit the scope of the invention to these specific embodiments. The scope of the invention is at least as broad as given by the following claims.

What is claimed is:

1. A method of using an inductive pulse forming network comprising:
   providing a network capacitor;
   coupling a network switch, a second network switch, and a load switch in series with said network capacitor;
   coupling a network inductor in parallel with a load at a point between said second network switch and said load switch and at a point between said load and said network capacitor;
   providing an arc suppression system switch;
   coupling in parallel with said network inductor an arc suppression system impedance device, through said arc suppression system switch, at a point between said first network switch and said second network switch and at a point between said network capacitor and said network inductor; and
   initially setting switches comprising:
   setting said network switch open;
   setting said load switch open;
   setting said second network switch closed;
   setting said arc suppression system switch open;
   charging said network capacitor from an outside prime power supply;
   when said network capacitor is charged, closing said network switch thereby allowing energy stored in said network capacitor to transfer to a magnetic field of said network inductor;
   when said energy stored in said network capacitor has transferred to said magnetic field of said network inductor, closing said load switch and closing said arc suppression system switch;
   opening said second network switch thereby allowing a high energy pulse to transfer to said load; and
   powering said load with said high energy pulse.

2. The method of claim 1 wherein said load comprises:
   a railgun resistance;
   a railgun inductance;
   a pair of conductive rails; and
   a conductive projectile positioned between and in contact with said pair of conductive rails,
   wherein said powering said load with said high energy pulse propels said conductive projectile along said conductive rails and out an exit point.

3. The method of claim 1 wherein said network capacitor is a low-voltage capacitor in the range of about 2 to about 50 volts.

4. The method of claim 1 wherein said network capacitor is a high energy density capacitor having an energy density greater than about 2.5 MegaJouls/meter$^3$.

5. The method of claim 1 further comprising coupling at least one additional network capacitor in parallel with said network capacitor, said at least one additional network capacitor and said network capacitor forming a network capacitor bank.

6. The method of claim 1 further comprising coupling at least one additional network inductor in series with said network inductor said at least one additional network inductor and said network inductor forming a network inductor bank.

7. The method of claim 1 wherein said network capacitor stores electric field energy sufficient to operate said load more than once.

* * * * *